(12) United States Patent
Ootaka

(10) Patent No.: US 8,378,819 B2
(45) Date of Patent: Feb. 19, 2013

(54) ELECTROSTATIC OCCUPANT DETECTION APPARATUS AND METHOD FOR DETECTING FAILURE OF THE SAME

(75) Inventor: Kouji Ootaka, Toyohashi (JP)

(73) Assignee: Denso Corporation, Kariya (JP)

( * ) Notice: Subject to any disclaimer, the term of this patent is extended or adjusted under 35 U.S.C. 154(b) by 494 days.

(21) Appl. No.: 12/802,813

(22) Filed: Jun. 15, 2010

(65) Prior Publication Data

US 2010/0315234 A1   Dec. 16, 2010

(30) Foreign Application Priority Data

Jun. 16, 2009   (JP) ................................. 2009-143338

(51) Int. Cl.
*G08B 13/26* (2006.01)
*G08B 23/00* (2006.01)
*G01R 27/26* (2006.01)
*B60R 22/00* (2006.01)
*B60R 21/16* (2006.01)

(52) U.S. Cl. ...................... 340/561; 340/573.1; 340/660; 340/667; 340/551; 324/662; 324/663; 701/45; 280/734; 280/735

(58) Field of Classification Search .................. 340/660, 340/664, 667, 666, 665, 562, 561, 663, 567, 340/551, 552, 426.26, 565, 636.11, 636.12, 340/425.5, 573.1; 324/666.1, 663, 662; 180/272, 180/233; 280/734, 735
See application file for complete search history.

(56) References Cited

U.S. PATENT DOCUMENTS

| | | | |
|---|---|---|---|
| 6,335,684 B1 * | 1/2002 | Eisenmann et al. | 340/562 |
| 7,271,730 B2 * | 9/2007 | Kimura et al. | 340/667 |
| 7,497,465 B2 * | 3/2009 | Wato et al. | 280/735 |
| 7,575,085 B2 * | 8/2009 | Kamizono et al. | 180/273 |
| 7,791,476 B2 * | 9/2010 | Hawkins et al. | 340/561 |
| 7,796,017 B2 * | 9/2010 | Kiribayashi | 340/425.5 |
| 8,040,241 B2 * | 10/2011 | Kamizono et al. | 340/561 |
| 8,078,362 B2 * | 12/2011 | Yamanaka et al. | 701/45 |
| 8,120,483 B2 * | 2/2012 | Ootaka et al. | 340/561 |
| 2006/0164254 A1 | 7/2006 | Kamizono et al. | |
| 2008/0100425 A1 | 5/2008 | Kiribayashi | |
| 2008/0198024 A1 | 8/2008 | Kamizono et al. | |

FOREIGN PATENT DOCUMENTS

| | | |
|---|---|---|
| JP | 07-270541 | 10/1995 |
| JP | 11-097997 | 4/1999 |
| JP | 2006-242907 | 9/2006 |
| JP | 2008-111809 | 5/2008 |
| JP | 2008-203150 | 9/2008 |

OTHER PUBLICATIONS

Office action dated May 17, 2011 in corresponding Japanese Application No. 2009-143338.

* cited by examiner

*Primary Examiner* — Daniel Wu
*Assistant Examiner* — Mancil Littlejohn
(74) *Attorney, Agent, or Firm* — Harness, Dickey & Pierce, PLC

(57) ABSTRACT

A main electrode is located in a vehicle seat. A guard electrode is located between a grounded vehicle body and the main electrode. A detection unit selectively applies an alternating voltage signal to the main electrode and the guard electrode, sets the main electrode and the guard electrode to be in an open state or a grounded state, detects an electric current of one of the main electrode and the guard electrode, converts the selected electric current into a voltage value, and detects an overcurrent in the main electrode and the guard electrode. A control unit determines the main electrode and the guard electrode to be an open failure, a power supply short failure, a grounded failure, or a short failure with the guard electrode, according to one or a combination of the voltage value and detection or non-detection of an overcurrent.

11 Claims, 7 Drawing Sheets

| FAILURE MODE | | NO. | STATUS | | | DETECTED ELECTRODE | DETERMINATION |
|---|---|---|---|---|---|---|---|
| | | | MAIN ELECTRODE | GUARD ELECTRODE | SUB-ELECTRODE | | |
| MAIN ELECTRODE | OPEN | 1 | a | SINE WAVE | SINE WAVE | OPEN | MAIN | NO CHANGE BETWEEN 1a AND 1b AND OVER CURRENT NOT DETECTED IN 1c |
| | | | b | SINE WAVE | SINE WAVE | GND | MAIN | |
| | | | c | SINE WAVE | GND | OPEN | MAIN | |
| | PWR SHORT | 2 | a | SINE WAVE | SINE WAVE | OPEN | MAIN | OVER CURRENT DETECTED |
| | GND SHORT | 3 | a | SINE WAVE | SINE WAVE | OPEN | MAIN | OVER CURRENT DETECTED |
| | MAIN-GUARD SHORT | 4 | a | SINE WAVE | SINE WAVE | OPEN | MAIN | DIFFERENCE BETWEEN 4a AND 4b > THRESHOLD |
| | | | b | SINE WAVE | OPEN | OPEN | MAIN | |
| | MAIN-SUB SHORT | 5 | a | SINE WAVE | SINE WAVE | GND | MAIN | OVER CURRENT DETECTED |
| GUARD ELECTRODE | OPEN | 6 | a | SINE WAVE | GND | OPEN | MAIN | OVER CURRENT NOT DETECTED |
| | PWR SHORT | 7 | a | SINE WAVE | SINE WAVE | OPEN | GUARD | OVER CURRENT DETECTED |
| | GND SHORT | 8 | a | SINE WAVE | SINE WAVE | OPEN | GUARD | OVER CURRENT DETECTED |
| | GUARD-SUB SHORT | 9 | a | SINE WAVE | SINE WAVE | GND | GUARD | OVER CURRENT DETECTED |
| SUB ELECTRODE | OPEN | 10 | a | SINE WAVE | SINE WAVE | OPEN | MAIN | DIFFERENCE BETWEEN 10a AND 10b ≤ THRESHOLD |
| | | | b | SINE WAVE | SINE WAVE | GND | MAIN | |
| | PWR SHORT | 11 | a | OPEN | SINE WAVE | SINE WAVE | SUB | OVER CURRENT DETECTED |
| | GND SHORT | 12 | a | OPEN | SINE WAVE | SINE WAVE | SUB | OVER CURRENT DETECTED |

FIG. 2

| | FAILURE MODE | NO. | STATUS | | | FAILURE DETECTION | |
|---|---|---|---|---|---|---|---|
| | | | MAIN ELECTRODE | GUARD ELECTRODE | SUB-ELECTRODE | DETECTED ELECTRODE | DETERMINATION |
| MAIN ELECTRODE | OPEN | 1 a | SINE WAVE | SINE WAVE | OPEN | MAIN | NO CHANGE BETWEEN 1a AND 1b AND OVER CURRENT NOT DETECTED IN 1c |
| | | 1 b | SINE WAVE | SINE WAVE | GND | MAIN | |
| | | 1 c | SINE WAVE | GND | OPEN | MAIN | |
| | PWR SHORT | 2 a | SINE WAVE | SINE WAVE | OPEN | MAIN | OVER CURRENT DETECTED |
| | GND SHORT | 3 a | SINE WAVE | SINE WAVE | OPEN | MAIN | OVER CURRENT DETECTED |
| | MAIN-GUARD SHORT | 4 a | SINE WAVE | SINE WAVE | OPEN | MAIN | DIFFERENCE BETWEEN 4a AND 4b > THRESHOLD |
| | | 4 b | SINE WAVE | OPEN | OPEN | MAIN | |
| | MAIN-SUB SHORT | 5 a | SINE WAVE | SINE WAVE | GND | MAIN | OVER CURRENT DETECTED |
| GUARD ELECTRODE | OPEN | 6 a | SINE WAVE | GND | OPEN | MAIN | OVER CURRENT NOT DETECTED |
| | PWR SHORT | 7 a | SINE WAVE | SINE WAVE | OPEN | GUARD | OVER CURRENT DETECTED |
| | GND SHORT | 8 a | SINE WAVE | SINE WAVE | OPEN | GUARD | OVER CURRENT DETECTED |
| | GUARD-SUB SHORT | 9 a | SINE WAVE | SINE WAVE | GND | GUARD | OVER CURRENT DETECTED |
| SUB ELECTRODE | OPEN | 10 a | SINE WAVE | SINE WAVE | OPEN | MAIN | DIFFERENCE BETWEEN 10a AND 10b ≤ THRESHOLD |
| | | 10 b | SINE WAVE | SINE WAVE | GND | MAIN | |
| | PWR SHORT | 11 a | OPEN | SINE WAVE | SINE WAVE | SUB | OVER CURRENT DETECTED |
| | GND SHORT | 12 a | OPEN | SINE WAVE | SINE WAVE | SUB | OVER CURRENT DETECTED |

ELECTROSTATIC OCCUPANT DETECTION APPARATUS AND METHOD FOR DETECTING FAILURE OF THE SAME

CROSS REFERENCE TO RELATED APPLICATIONS

This application is based on and incorporates herein by reference Japanese Patent Application No. 2009-143338 filed on Jun. 16, 2009.

FIELD OF THE INVENTION

The present invention relates to an electrostatic occupant detection apparatus configured to detect an occupant seated on a seat of a vehicle. In particular, the present invention relates to an electrostatic occupant detection apparatus configured to detect a malfunction of an electrostatic sensor, such as an open failure and a short-circuit failure. The present invention further relates to a method for detecting a failure of the electrostatic occupant detection apparatus.

BACKGROUND OF THE INVENTION

For example, Japanese unexamined patent publication 2006-242907, which corresponds to US patent application publication 2006/0164254 A1, discloses an electrostatic occupant detection apparatus. Such an electrostatic occupant detection apparatus includes an electrostatic sensor having a main electrode, a sub-electrode, and a guard electrode. The main electrode is located in a seat portion of a vehicle. The sub-electrode is spaced from the main electrode. The guard electrode is located between a vehicle body, which is conductive with a vehicle grounding portion, and the main electrode and spaced from the vehicle body and the vehicle grounding portion. The electrostatic sensor sets the main electrode and the guard electrode to be in the same potential to form an electric field between the main electrode and the vehicle body so as to detect an electric capacity of an occupant on a seat portion and the like. The electrostatic sensor outputs an electric current or a voltage corresponding to change in a weak electric field caused between the main electrode and the vehicle body. An occupant detection electronic control unit (ECU) recognizes an occupant according to the outputted electric current or the voltage value.

In such a manner, an electrostatic sensor detects an electric capacity of an occupant and the like. However, when the electrostatic sensor is out of order, the electrostatic sensor may make an erroneous determination of an occupant. In view of such a problem, U.S. patent application publication 2006/0164254 A1 proposes an electric capacitance occupant sensor configured to self-detect a failure of the electrostatic sensor. The electric capacitance occupant sensor includes an occupant detection electrode for detecting an occupant being seated and a capacitance reduction electrode opposed to the occupant detection electrode. The capacitance reduction electrode reduces an electric capacity between the occupant detection electrode when an occupant is not seated and a seat frame from an electric capacity between the occupant detection electrode when an occupant is seated and the seat frame. The seat frame is electrically conducted with a vehicle grand (GND). When detecting a failure, the electric capacitance occupant sensor applies a voltage between the occupant detection electrode and the capacitance reduction electrode to detect an electric capacity between the occupant detection electrode and the capacitance reduction electrode. In the present detection, when a wiring of the occupant dejection electrode or the capacitance reduction electrode is disconnected, the electric capacitance occupant sensor is in a non-detection state of an electric capacity. In this manner, a failure of the electric capacitance occupant sensor is detectable when an occupant is not seated.

The occupant detection electrostatic sensor of US patent application publication 2006/0164254 A1 is capable of self-detecting a failure of the sensor when a wiring of the occupant detection electrode or the capacitance reduction electrode is disconnected to cause an open failure. Nevertheless, the occupant detection electrostatic sensor cannot determine a short failure caused by short-circuit between the wiring and another electric conduction portion. It is significantly important to detect a failure of an electrostatic sensor for detecting an electric capacity of an occupant. In particular, an electrostatic sensor may include a main electrode, a sub-electrode, and a guard electrode. In such a case, an open failure and a short failure of each of the electrodes need to be detected.

SUMMARY OF THE INVENTION

In view of the foregoing and other problems, it is an object of the present invention to produce an electrostatic occupant detection apparatus including at least a main electrode and a guard electrode, the electrostatic occupant detection apparatus configured to detect an open failure and a short failure of the main electrode and the guard electrode. It is an object of the present invention to produce a method for detecting a failure of the electrostatic occupant detection apparatus.

According to one aspect of the present invention, an electrostatic occupant detection apparatus comprises an electrostatic sensor including a main electrode, which is located in a vehicle seat, and a guard electrode, which is located between a vehicle body and the main electrode and spaced from the vehicle body and the main electrode, the vehicle body being conductive with a vehicle grounded portion. The electrostatic occupant detection apparatus further comprises a sensor-characteristics detection unit configured to: selectively apply an alternating voltage signal from a signal source to each of the main electrode and the guard electrode; selectively cause each of the main electrode and the guard electrode to be opened or grounded; select an electric current in one of the main electrode and the guard electrode and convert the selected electric current into a voltage value; and separately detect an overcurrent in each of the main electrode and the guard electrode when applying an alternating voltage signal. The electrostatic occupant detection apparatus further comprises an arithmetic control unit configured to, according to one or a combination of the voltage value detected by the sensor-characteristics detection unit and detection or non-detection of an overcurrent by the sensor-characteristics detection unit: i) determine whether each of the main electrode and the guard electrode is an open failure, a power supply short failure, in which a connection path from a power supply to the signal source is short-circuited with another electric conduction element, or a grounded failure; and ii) determine whether a short failure occurs between the main electrode and the guard electrode.

According to another aspect of the present invention, a method for detecting a failure of an electrostatic occupant detection apparatus including a main electrode, which is located in a vehicle seat, and a guard electrode, which is located between a vehicle body the main electrode and spaced from the vehicle body and the main electrode, the vehicle body being conductive with a vehicle grounded portion, the method comprises selectively applying an alternating voltage signal from a signal source to each of the main electrode and the guard electrode of the electrostatic sensor. The method further comprises selectively causing each of the main electrode and the guard electrode to be opened or grounded. The method further comprises selecting an electric current in one of the main electrode and the guard electrode and converting the selected electric current into a voltage value. The method further comprises separately detecting an overcurrent in each of the main electrode and the guard electrode when applying an alternating voltage signal. The method further comprises determining whether each of the main electrode and the guard electrode is an open failure, a power supply short failure, a grounded failure, or a short failure therebetween, according to one or a combination of the detected voltage value and detection or non-detection of an overcurrent, wherein in a power supply short failure, a connection path from a power supply to the signal source is short-circuited with another electric conduction element.

According to another aspect of the present invention, a method for detecting a failure of an electrostatic occupant detection apparatus including a main electrode, which is located in a vehicle seat, a guard electrode, which is located between a vehicle body and the main electrode and spaced from the vehicle body and the main electrode, and a sub-electrode, which is located in the vehicle seat and spaced from the main electrode, the vehicle body being conductive with a vehicle grounded portion, the method comprises selectively applying an alternating voltage signal from a signal source to each of the main electrode, the sub-electrode, and the guard electrode. The method further comprises selectively causing each of the main electrode, the sub-electrode, and the guard electrode to be opened or grounded. The method further comprises selecting an electric current in, one of the main electrode, the sub-electrode, and the guard electrode and converting the selected electric current into a voltage value. The method further comprises separately detecting an overcurrent in each of the main electrode, the sub-electrode, and the guard electrode when applying an alternating voltage signal. The method further comprises determining whether each of the main electrode, the sub-electrode, and the guard electrode is an open failure, a power supply short failure, a grounded failure, according to one or a combination of the detected voltage value and detection or non-detection of an overcurrent, wherein in a power supply short failure, a connection path from a power supply to the signal source is short-circuited with another electric conduction element. The method further comprises determining whether a short failure occurs between the main electrode and the guard electrode, a short failure occurs between the main electrode and the sub-electrode, and a short failure occurs between the guard electrode and the sub-electrode.

BRIEF DESCRIPTION OF THE DRAWINGS

The above and other objects, features and advantages of the present invention will become more apparent from the following detailed description made with reference to the accompanying drawings. In the drawings:

FIG. 2 is a view showing an operation of the electrostatic occupant detection apparatus in determination of a failure mode according to the embodiment;

DETAILED DESCRIPTION OF PREFERRED EMBODIMENTS

Figure 1:
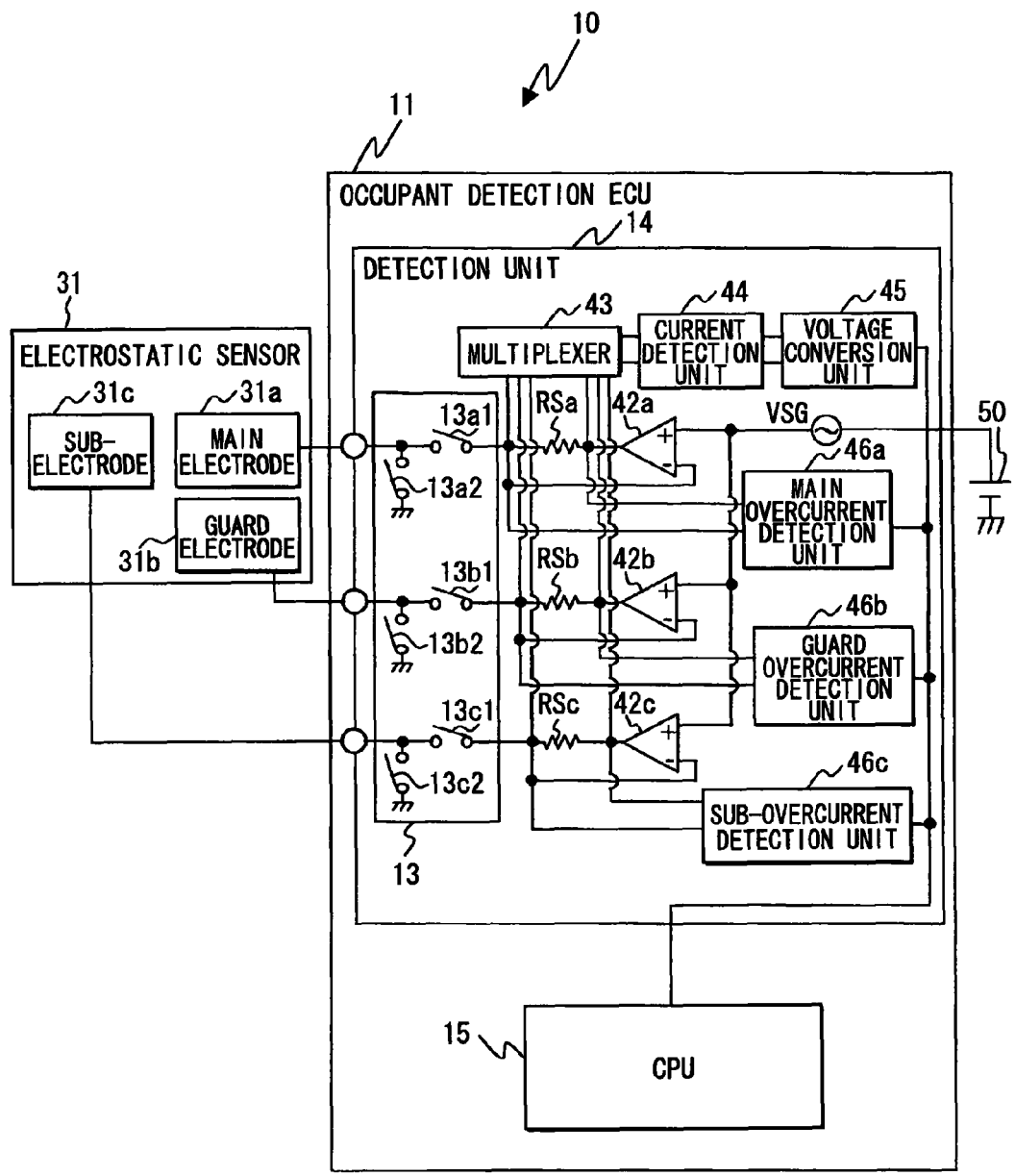
FIG. 1 is a block diagram showing an electrostatic occupant detection apparatus according to an embodiment.

As follows, an embodiment will be described with reference to drawings. FIG. 1 is a block diagram showing an electrostatic occupant detection apparatus according to an embodiment. The electrostatic occupant detection apparatus 10 shown in FIG. 1 includes an occupant detection ECU 11 and an electrostatic sensor 31 connected to the occupant detection ECU 11. The electrostatic sensor 31 includes a main electrode 31a, a sub-electrode 31c, and a guard electrode 31b. The main, electrode 31a is located at a seat portion of a vehicle (not shown). The sub-electrode 31c is spaced from the main electrode 31a and located at the front side of the seat portion. The guard electrode 31b is located between a vehicle body and the main electrode 31a and spaced from the vehicle body and the main electrode 31a. The vehicle body functions as a vehicle grand (GND) to conduct with a vehicle grounding portion (not shown).

The occupant detection ECU 11 includes a CPU 15 and a sensor-characteristics detection unit 14. The CPU 15 functions as an arithmetic control unit. The sensor-characteristics detection unit 14 includes a switching unit 13, current sensing resistors RSa, RSb, RSc, operational amplifiers 42a, 42b, 42c, and a vector signal generator (VSG) of a signal source. The switching unit 13 includes a main electrode connection switch 13a1, a guard electrode connection switch 13b1, a sub-electrode connection switch 13c1, a main electrode grounding switch 13a2, a guard electrode grounding switch 13b2, and a sub-electrode grounding switch 13c2. The current sensing resistors RSa, RSb, RSc are respectively connected to the connection switches 13a1, 13b1, 13c1 of the switching unit 13. The operational amplifiers 42a, 42b, 42c are respectively connected to the current sensing resistors RSa, RSb, RSc to function as a driver. The VSG is connected to noninverting input terminals of the operational amplifiers 42a, 42b, 42c. The sensor-characteristics detection unit 14 further includes a multiplexer 43, a current detection unit 44, a voltage conversion unit 45, a main overcurrent detection unit 46a, a guard overcurrent detection unit 46b, and a sub-overcurrent detection unit 46c. The multiplexer 43 is connected to an end of each of the current sensing resistors RSa, Rsb, RSc, and selects one of the ends. The current detection unit 44 detects an electric current flowing to one of the current sensing resistors RSa, Rsb, RSc selected by the multiplexer 43. The voltage conversion unit 45 converts the electric current detected by the current detection unit 44 into a voltage value. The main overcurrent detection unit 46a detects a terminal voltage of the current sensing resistor RSa so as to detect an overcurrent flowing into the main electrode 31a. The guard overcurrent detection unit 46b detects a terminal voltage of the current sensing resistor RSb so as to detect an overcurrent flowing into the guard electrode 31b. The sub-overcurrent detection unit 46c detects a terminal voltage of the current sensing resistor RSc so as to detect an overcurrent flowing into the sub-electrode 31c. The VSG is connected to a vehicle battery 50 via a wire harness. The vehicle battery 50 is located outside of the occupant detection ECU 11.

In the present structure, when the main electrode grounding switch 13a2, the guard electrode grounding switch 13b2, and the sub-electrode grounding switch 13c2 are set to OFF and are not connected to the vehicle GND, the main electrode connection switch 13a1, the guard electrode connection switch 13b1, and the sub-electrode connection switch 13c1 are arbitrary set to ON. Thereby, the VSG applies a sine wave to the electrostatic sensor 31 selectively through each of the operational amplifiers 42a, 42b, 42c and each of the current sensing resistors RSa, RSb, RSc. Thus, each of the current sensing resistors RSa, RSb, RSc selectively causes a potential difference according to an impedance caused by an occupant on the electrostatic sensor 31.

The multiplexer 43 successively selects the caused potential difference and outputs the selected signal to the current detection unit 44. The current detection unit 44 detects an electric current and outputs the detected electric current. The voltage conversion unit 45 converts the outputted electric current into a voltage value. In the present structure, an electric capacity of each of the main electrode 31a, the guard electrode 31b, and the sub-electrode 31c or an electric capacity of a combination among the main electrode 31a, the guard electrode 31b, and the sub-electrode 31c is detected as a voltage value. Further, the CPU 15 processes the detected electric capacity to obtain occupant determination data.

The CPU 15 determines whether a detection object on the seat portion is a child restraint system (CRS), a child, or an adult or determines whether a detection object is not on the seat portion (vacant seat) according to the occupant determination data. The CPU 15 transmits a determination result whether to deploy an absorber or not to deploy an absorber to an absorber ECU. According to the determination result, the absorber ECU determines whether the vehicle has caused a collision and performs a control of deployment or non-deployment of a passenger seat absorber based on the determination of a collision.

As described above, the switching unit 13 is switched to detect an electric capacity according to an electric flux line generated from the electrostatic sensor 31. Specifically, an electric current flows into each of the current sensing resistors RSa, RSb, RSc according to the signal (sine wave) supplied from the VSG, and the flowing electric current is converted into a voltage so as to detect the electric capacity. The CPU 15 determines an occupant according to an electric capacity between the main electrode 31a and the vehicle GND when the switching unit 13 selects the main electrode 31a and the guard electrode 31b. Alternatively, the CPU 15 determines an occupant according to an electric capacity between the sub-electrode 31c and the vehicle GND when the switching unit 13 selects the sub-electrode 31c and the guard electrode 31b. Further, the CPU 15 determines a water exposure of the seat 33 according to an electric capacity between the main electrode 31a and the sub-electrode 31c, when the switching unit 13 selects the main electrode 31a, the guard electrode 31b, and the sub-electrode 31c.

In the present embodiment, the sensor-characteristics detection unit 14 has the above-described structure. The CPU 15 recognizes a voltage value of each of the main electrode 31a, the guard electrode 31b, and sub-electrode 31c, which are detected by the voltage conversion unit 45 with the switching operation of the switching unit 13 when the electrostatic sensor 12 is applied with the sine wave. Further, the CPU 15 recognizes an overcurrent detected by each of the main overcurrent detection unit 46a, the guard overcurrent detection unit 46b, and the sub-overcurrent detection unit 46c with the switching operation of the switching unit 13 when the electrostatic sensor 12 is applied with the sine wave. The CPU 15 determines an open failure and a short failure of the electrostatic sensor 31 according to the recognized signals.

As shown by the first and second rows of FIG. 2, the main electrode 31a of the electrostatic sensor 31 has failure modes including an open failure, a power supply short failure, a GND short failure (grounding failure), a main-guard electrodes short failure, and a main-sub electrodes short failure. The guard electrode 31b of the electrostatic sensor 31 has failure modes including an open failure, a power supply short failure, a GND short failure, and a guard-sub electrodes short failure. The sub-electrode 31c of the electrostatic sensor 31 has failure modes including an open failure, a power supply short failure, and a GND short failure. The power supply short failure is caused when a wiring path such as a wire harness extended from the vehicle battery 50 to the VSG to apply a sine wave to each of the main electrode 31a, the guard electrode 31b, and the sub-electrode 31c, causes a short circuit with another electric conductive element.

Subsequently, an operation of the electrostatic occupant detection apparatus 10 when making a failure mode determination will be described with reference to the view of FIG. 2 and the flow charts of FIGS. 3 to 11.

Figure 3:
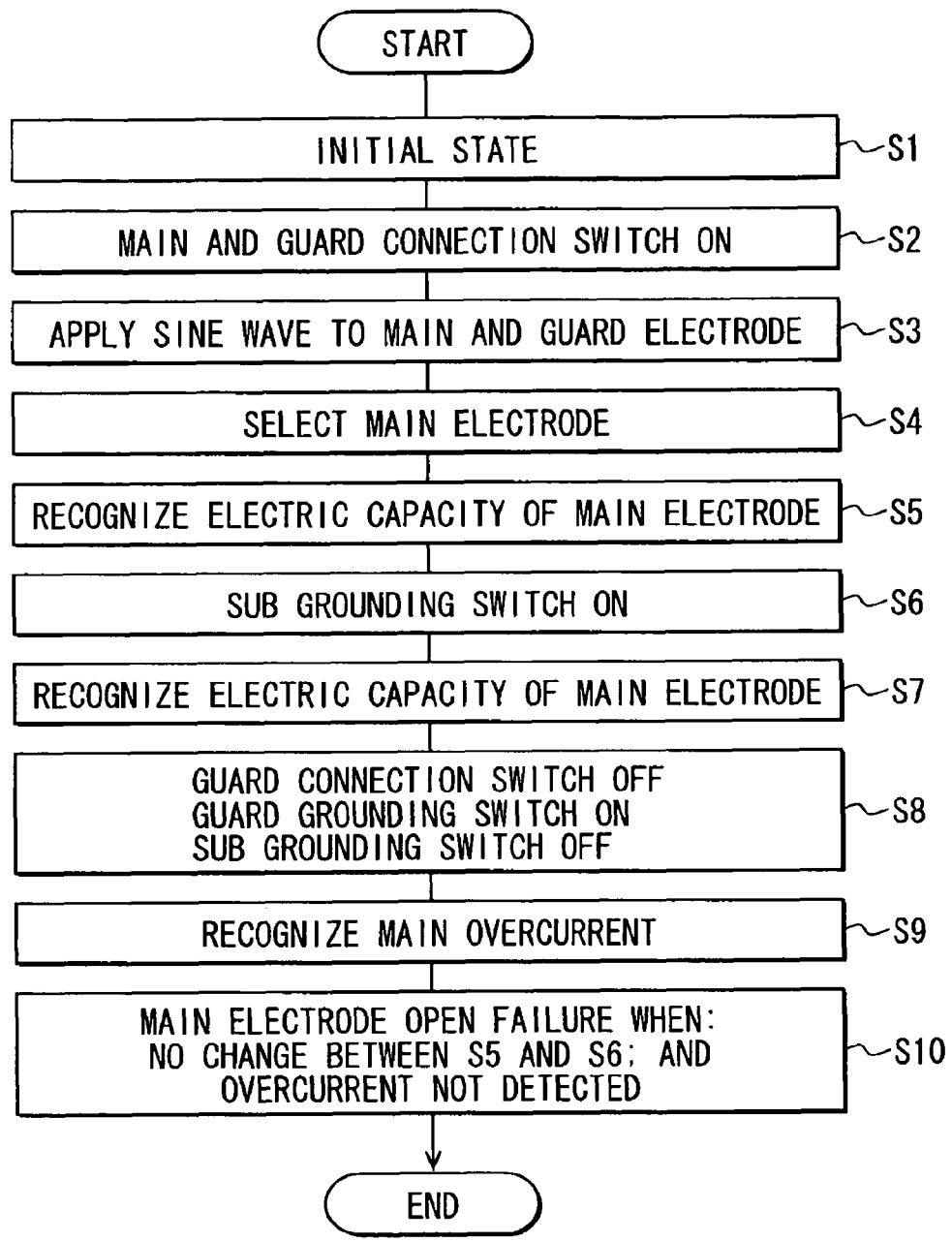
FIG. 3 is a flow chart showing an operation to recognize an open failure of a main electrode of the electrostatic occupant detection apparatus according to the embodiment.

First, a determination of an open failure of the main electrode 31a will be described with reference to FIG. 3. At step S1, it is supposed that the electrostatic occupant detection apparatus 10 is in an initial state. In the present initial state, all the main electrode connection switch 13a1, the guard electrode connection switch 13b1, and the sub-electrode connection switch 13c1 of the switching unit 13 are deactivated (OFF). In addition, all the main electrode grounding switch 13a2, the guard electrode grounding switch 13b2, and the sub-electrode grounding switch 13c2 of the switching unit 13 are deactivated. Thereby, each of the main electrode 31a, the guard electrode 31b, and the sub-electrode 31c are in an open state.

At step S2, both the main electrode connection switch 13a1 and the guard electrode connection switch 13b1 are activated (turned ON). At step S3, the VSG applies a sine wave to both the main electrode 31a and the guard electrode 31b. In the application state of the sine wave, the sub-electrode 31c is in an open state. Thereby, each of the electrodes 31a, 31b, 31c is in an electrode state specified by the No. 1a of FIG. 2. AT step S4, the multiplexer 43 selects both ends of the current sensing resistor RSa connected to the main electrode 31a. Thereby, at step S5, the voltage conversion unit 45 detects a voltage value corresponding to an electric capacity of the main electrode 31a. Thus, the CPU 15 recognizes the voltage value as a detection value of the electric capacity of the main electrode 31a.

Subsequently, at step S6, the sub-electrode grounding switch 13c2 is activated (turned ON), and the sub-electrode 31c is grounded to be in a grounding state. Thereby, as specified by No. 1b, the main electrode 31a and the guard electrode 31b are applied with a sine wave to be in a sine-wave application state, and the sub-electrode 31c is in the grounding state. In the present state, at step S7, the voltage conversion unit 45 detects a voltage value of the main electrode 31a. Thus, the CPU 15 recognizes the detected voltage value of the main electrode 31a as a detection value of an electric capacity.

Subsequently, at step S8, the guard electrode connection switch 13b1 is deactivated, the guard electrode grounding switch 13b2 is activated, and the sub-electrode grounding switch 13c2 is deactivated. Thereby, as specified by No. 1c, the main electrode 31a is applied with a sine wave to be in a sine-wave application state, the guard electrode 31b is in a grounding state, and the sub-electrode 31c is in an open state. In the present state, at step S9, the CPU 15 recognizes a detection state of the main overcurrent detection unit 46a.

At step S10, according to the recognition results, when the CPU 15 determines that detection values do not change between the states of No. 1a and No. 1b, and when the CPU 15 determines that an overcurrent is not detected in the state of No. 1c, the CPU 15 determines the main electrode 31a to be an open failure. In a state other than the present case, the CPU 15 determines the main electrode 31a not to be an open failure. After the present determination, the switching unit 13 is returned to the initial state.

Figure 4:
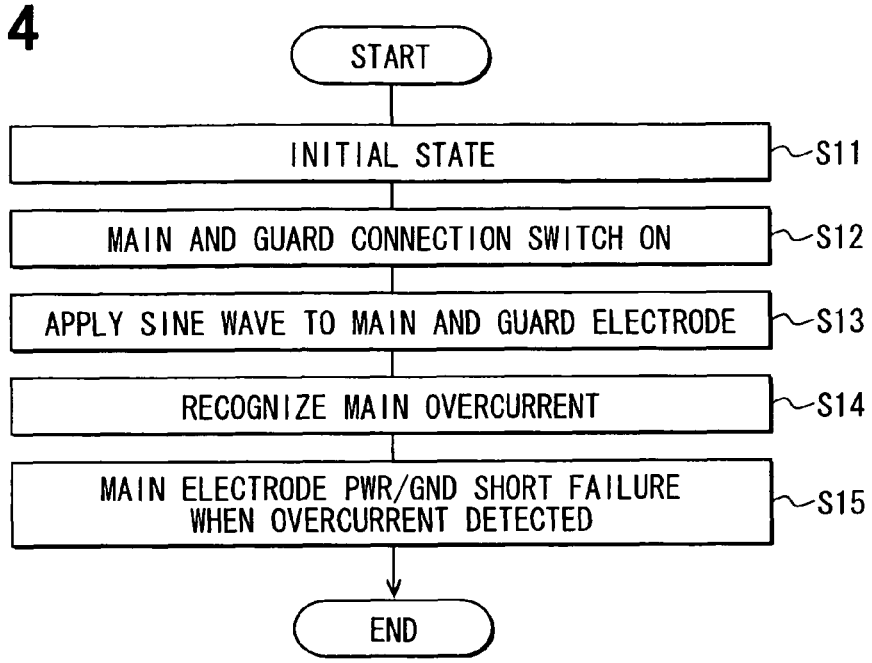
FIG. 4 is a flow chart showing an operation to recognize a power supply short failure of the main electrode of the electrostatic occupant detection apparatus according to the embodiment.

Subsequently, a determination of a power supply short failure of the main electrode 31a will be described with reference to FIG. 4. At step S11, the electrostatic occupant detection apparatus 10 is in the initial state. Subsequent to step S11, at step S12, both the main electrode connection switch 13a1 and the guard electrode connection switch 13b1 are activated (turned ON). Subsequently, at step S13, the VSG applies a sine wave to both the main electrode 31a and the guard electrode 31b. Thereby, as specified by No. 2a, the main electrode 31a and the guard electrode 31b are applied with a sine wave to be in a sine-wave application state, and the sub-electrode 31c is in an open state. In the present state, at step S14, the CPU 15 recognizes a detection state of the main overcurrent detection unit 46a. When the CPU 15 recognizes the detection state to be an overcurrent, at step S15, the CPU 15 determines the main electrode 31a to be a power supply short failure. In a state other than the present case, the CPU 15 determines the main electrode 31a not to be in a power supply short failure. After the present determination, the switching unit 13 is returned to the initial state.

Similarly, a determination of a GND short failure of the main electrode 31a will be described with reference to FIG. 4. At step S11, the electrostatic occupant detection apparatus 10 is in the initial state. Subsequent to step S11, at step S12, both the main electrode connection switch 13a1 and the guard electrode connection switch 13b1 are activated (turned ON). Subsequently, at step S13, the VSG applies a sine wave to both the main electrode 31a and the guard electrode 31b. Thereby, as specified by No. 3a, the main electrode 31a and the guard electrode 31b are applied with a sine wave to be in a sine-wave application state, and the sub-electrode 31c is in an open state. In the present state, at step S14, the CPU 15 recognizes a detection state of the main overcurrent detection unit 46a. When the CPU 15 recognizes the detection state to be an overcurrent, at step S15, the CPU 15 determines the main electrode 31a to be a GND short failure. In a state other than the present case, the CPU 15 determines the main electrode 31a not to be a GND short failure. After the present determination, the switching unit 13 is returned to the initial state.

Figure 5:
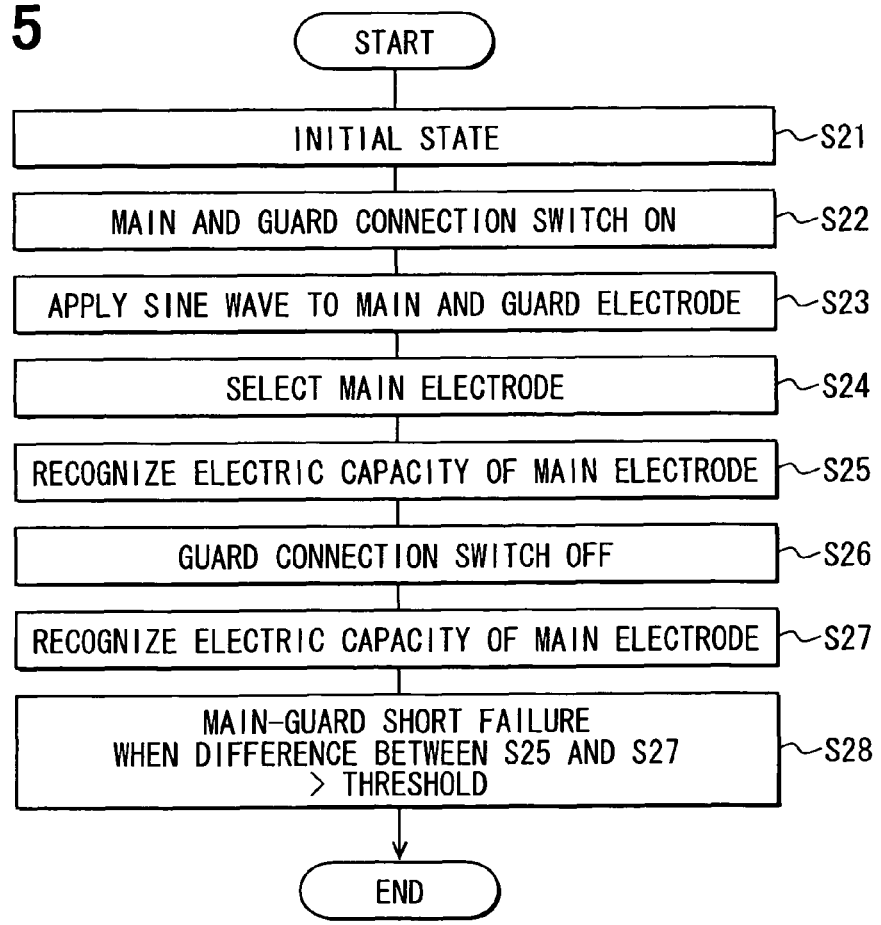
FIG. 5 is a flow chart showing an operation to recognize a main-guard electrodes short failure of the electrostatic occupant detection apparatus according to the embodiment.

Subsequently, a determination of a main-guard electrodes short failure will be described with reference to FIG. 5. At step S21, the electrostatic occupant detection apparatus 10 is in the initial state. Subsequent to step S21, at step S22, both the main electrode connection switch 13a1 and the guard electrode connection switch 13b1 are activated (turned ON). Subsequently, at step S23, the VSG applies a sine wave to both the main electrode 31a and the guard electrode 31b. Thereby, as specified by No. 4a, the main electrode 31a and the guard electrode 31b are applied with a sine wave to be in a sine-wave application state, and the sub-electrode 31c is in an open state. In the present state, at step S24, the multiplexer 43 selects both ends of the current sensing resistor RSa connected to the main electrode 31a. Thereby, at step S25, the voltage conversion unit 45 detects a voltage value corresponding to an electric capacity of the main electrode 31a. Thus, the CPU 15 recognizes the voltage value as a detection value of the electric capacity of the main electrode 31a.

Subsequently, at step S26, the guard electrode connection switch 13b1 is deactivated (turned OFF). Thereby, as specified by No. 4b, the main electrode 31a is applied with a sine wave to be in a sine-wave application state, and both the guard electrode 31b and the sub-electrode 31c are in an open state. In the present state, at step S27, the voltage conversion unit 45 detects a voltage value of the main electrode 31a. Thus, the CPU 15 recognizes the detected voltage value of the main electrode 31a as a detection value of an electric capacity. At step S28, according to the recognition result, when the difference between the detection value in the state of No. 4a and the detection value in the state of No. 4b is greater than a predetermined value (threshold), the CPU 15 determines that a main-guard electrodes short failure occurs. In a state other than the present case, the CPU 15 determines the main electrode 31a not to be a main-guard electrodes short failure. After the present determination, the switching unit 13 is returned to the initial state.

Figure 6:
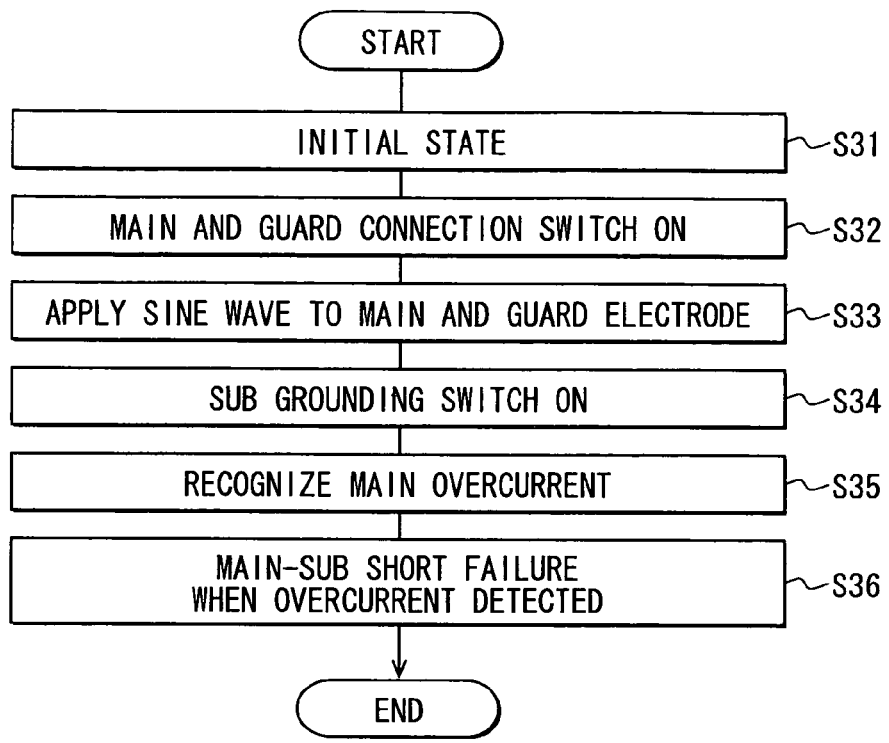
FIG. 6 is a flow chart showing an operation to recognize a main-sub electrodes short failure of the electrostatic occupant detection apparatus according to the embodiment.

Subsequently, a determination of a main-sub electrodes short failure will be described with reference to FIG. 6. At step S31, the electrostatic occupant detection apparatus 10 is in the initial state. Subsequent to step S31, at step S32, both the main electrode connection switch 13a1 and the guard electrode connection switch 13b1 are activated (turned ON). Subsequently, at step S33, the VSG applies a sine wave to both the main electrode 31a and the guard electrode 31b. At step S34, the sub-electrode grounding switch 13c2 is activated. Thereby, as specified by No. 5a, the main electrode 31a and the guard electrode 31b are applied with a sine wave to be in a sine-wave application state, and the sub-electrode 31c is in a grounding state. In the present state, at step S35, the CPU 15 recognizes a detection state of the main overcurrent detection unit 46a. When the CPU 15 recognizes the detection state to be an overcurrent, at step S36, the CPU 15 determines the main electrode 31a to be a main-sub electrodes short failure. In a state other than the present case, the CPU 15 determines the main electrode 31a not to be a main-sub electrodes short failure. After the present determination, the switching unit 13 is returned to the initial state.

Figure 7:
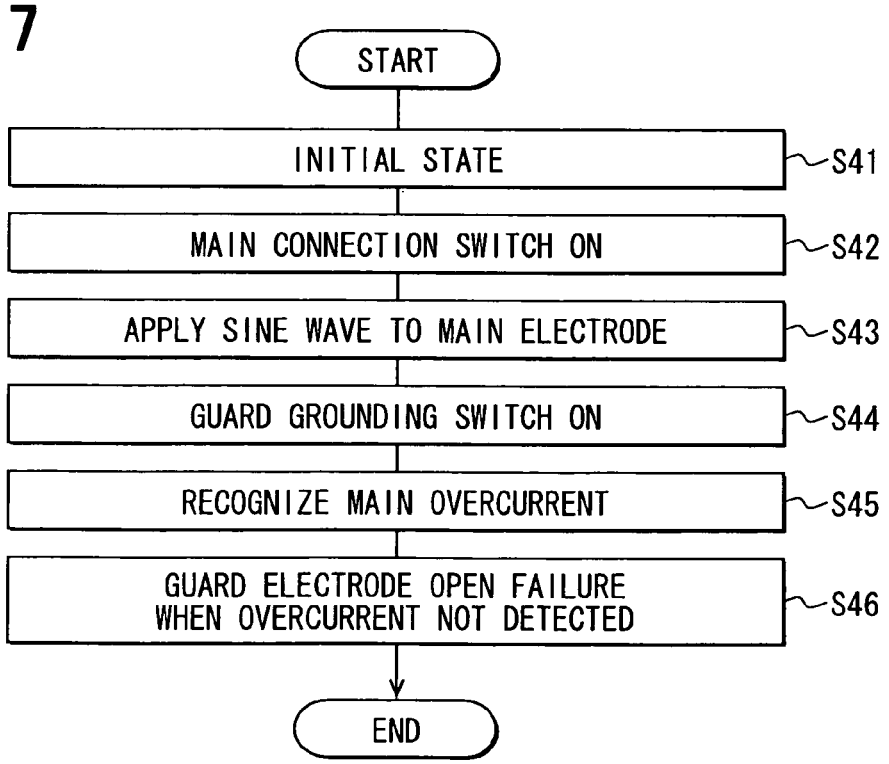
FIG. 7 is a flow chart showing an operation to recognize an open failure of a guard electrode of the electrostatic occupant detection apparatus according to the embodiment.

Subsequently, a determination of an open failure of the guard electrode 31b will be described with reference to FIG. 7. At step S41, the electrostatic occupant detection apparatus 10 is in the initial state. Subsequent to step S41, at step S42, the main electrode connection switch 13a1 is activated (turned ON). At step S43, the main electrode 31a is applied with a sine wave to be in a sine-wave application state. At step S44, the guard electrode grounding switch 13b2 is activated, and the guard electrode 31b is changed into a grounding state. Thereby, as specified by No. 6a, the main electrode 31a is applied with a sine wave to be in the sine-wave application state, the guard electrode 31b is in a grounding state, and the sub-electrode 31c is in an open state. In the present state, at step S45, the CPU 15 recognizes a detection state of the main overcurrent detection unit 46a. When the CPU 15 recognizes the detection state not to be an overcurrent, at step S46, the CPU 15 determines the guard electrode 31b to be an open failure. In a state other than the present case, the CPU 15 determines the guard electrode 31b not to be in an open failure. After the present determination, the switching unit 13 is returned to the initial state.

Figure 8:
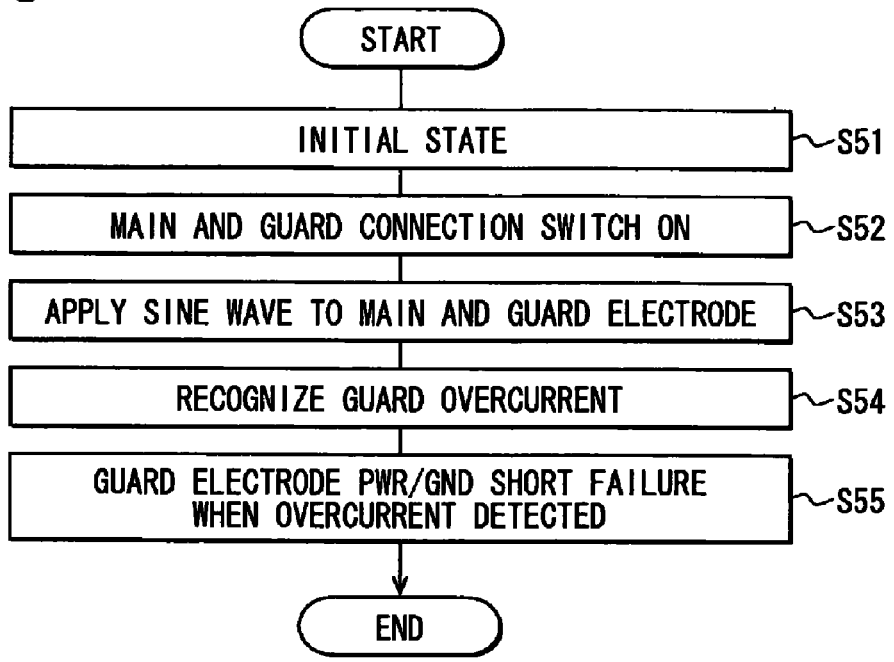
FIG. 8 is a flow chart showing an operation to recognize a power supply short failure of the guard electrode of the electrostatic occupant detection apparatus according to the embodiment.

Subsequently, a determination of a power supply short failure of the guard electrode 31b will be described with reference to FIG. 8. At step S51, the electrostatic occupant detection apparatus 10 is in an initial state. Subsequent to step S51, at step S52, both the main electrode connection switch 13a1 and the guard electrode connection switch 13b1 are activated (turned ON). Subsequently, at step S53, the VSG applies a sine wave to both the main electrode 31a and the guard electrode 31b. Thereby, as specified by No. 7a, the main electrode 31a and the guard electrode 31b are applied with a sine wave to be in a sine-wave application state, and the sub-electrode 31c is in an open state. In the present state, at step S54, the CPU 15 recognizes a detection state of the guard overcurrent detection unit 46b. When the CPU 15 recognizes the detection state to be an overcurrent, at step S55, the CPU 15 determines the guard electrode 31b to be a power supply short failure. In a state other than the present case, the CPU 15 determines the guard electrode 31b not to be a power supply short failure. After the present determination, the switching unit 13 is returned to the initial state.

Similarly, a determination of a GND short failure of the guard electrode 31b will be described with reference to FIG. 8. At step S51, the electrostatic occupant detection apparatus 10 is in the initial state. Subsequent to step S51, at step S52, both the main electrode connection switch 13a1 and the guard electrode connection switch 13b1 are activated (turned ON). Subsequently, at step S53, the VSG applies a sine wave to both the main electrode 31a and the guard electrode 31b. Thereby, as specified by No. 8a, the main electrode 31a and the guard electrode 31b are applied with a sine wave to be in a sine-wave application state, and the sub-electrode 31c is in an open state. In the present state, at step S54, the CPU 15 recognizes a detection state of the guard overcurrent detection unit 46b. When the CPU 15 recognizes the detection state to be an overcurrent, at step S55, the CPU 15 determines the guard electrode 31b to be a GND short failure. In a state other than the present case, the CPU 15 determines the guard electrode 31b not to be in a GND short failure. After the present determination, the switching unit 13 is returned to the initial state.

Figure 9:
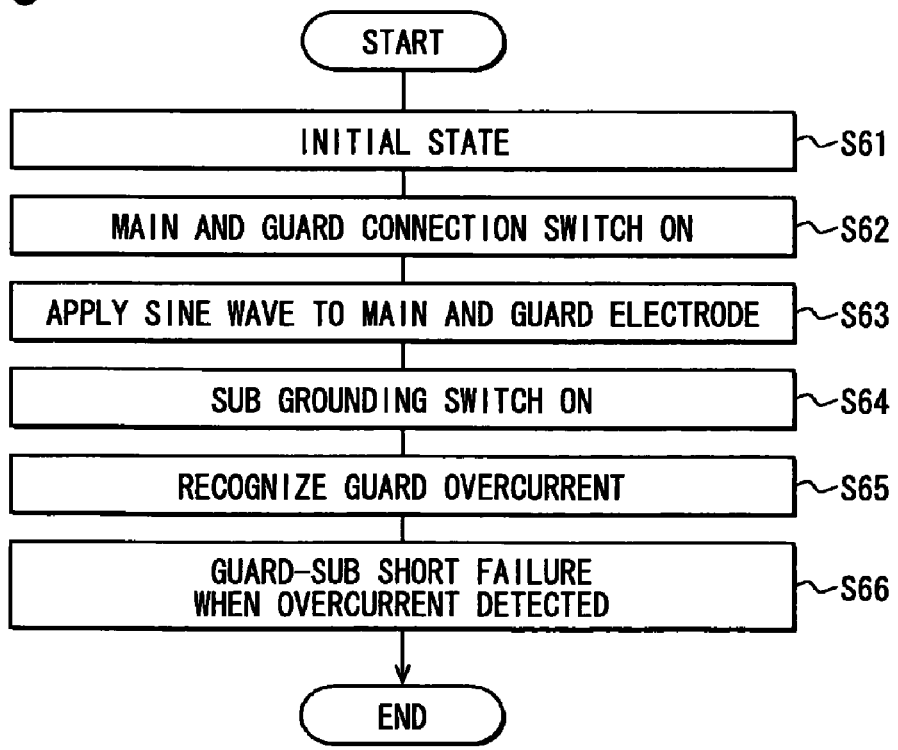
FIG. 9 is a flow chart showing an operation to recognize a guard-sub electrodes short failure of the electrostatic occupant detection apparatus according to the embodiment.

Subsequently, a determination of a guard-sub electrodes short failure will be described with reference to FIG. 9. At step S61, the electrostatic occupant detection apparatus 10 is in an initial state. Subsequent to step S61, at step S62, both the main electrode connection switch 13a1 and the guard electrode connection switch 13b1 are activated (turned ON). Subsequently, at step S63, the VSG applies a sine wave to both the main electrode 31a and the guard electrode 31b. At step S64, the sub-electrode grounding switch 13c2 is activated, and the sub-electrode 31c is changed into a grounding state. Thereby, as specified by No. 9a, the main electrode 31a and the guard electrode 31b are applied with a sine wave to be in a sine-wave application state, and the sub-electrode 31c is in a grounding state. In the present state, at step S65, the CPU 15 recognizes a detection state of the guard overcurrent detection unit 46b. When the CPU 15 recognizes the detection state to be an overcurrent, at step S66, the CPU 15 determines the guard electrode 31b to be a guard-sub electrodes short failure. In a state other than the present case, the CPU 15 determines the guard electrode 31b not to be a guard-sub electrodes short failure. After the present determination, the switching unit 13 is returned to the initial state.

Figure 10:
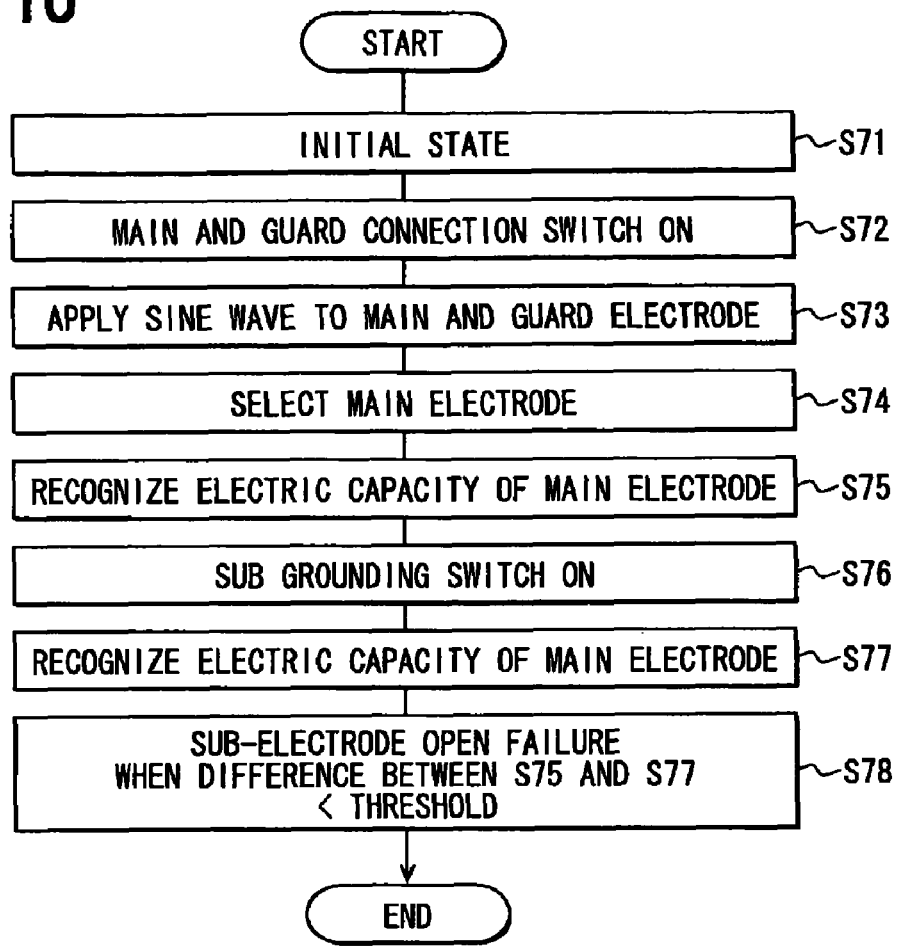
FIG. 10 is a flow chart showing an operation to recognize an open failure of a sub-electrode of the electrostatic occupant detection apparatus according to the embodiment.

Subsequently, a determination of an open failure of the sub-electrode 31c will be described with reference to FIG. 10. At step S71, the electrostatic occupant detection apparatus 10 is in an initial state. Subsequent to step S71, at step S72, both the main electrode connection switch 13a1 and the guard electrode connection switch 13b1 are activated (turned ON). Subsequently, at step S73, the VSG applies a sine wave to both the main electrode 31a and the guard electrode 31b to be in a sine-wave application state. Thereby, as specified by No. 10a, the main electrode 31a and the guard electrode 31b are applied with a sine wave to be in the sine-wave application state, and the sub-electrode 31c is in an open state. In the present state, at step S74, the multiplexer 43 selects both ends of the current sensing resistor RSa connected to the main electrode 31a. Thereby, at step S75, the voltage conversion unit 45 detects a voltage value corresponding to an electric capacity of the main electrode 31a. Thus, the CPU 15 recognizes the voltage value as a detection value of the electric capacity of the main electrode 31a.

Subsequently, at step S76, the sub-electrode grounding switch 13c2 is activated (turned ON), and the sub-electrode 31c is grounded to be in a grounding state. Thereby, as specified by No. 10b, the main electrode 31a and the guard electrode 31b are applied with a sine wave to be in a sine-wave application state, and the sub-electrode 31c is in a grounding state. In the present state, at step S77, the voltage conversion unit 45 detects a voltage value of the main electrode 31a. Thus, the CPU 15 recognizes the detected voltage value of the main electrode 31a as a detection value of an electric capacity. At step S78, according to the recognition result, when the difference between the detection value in the state of No. 10a and the detection value in the state of No. 10b is less than or equal to a predetermined value (threshold); the CPU 15 determines the sub-electrode 31c to be an open failure. In a state other than the present case, the CPU 15 determines the sub-electrode 31c not to be an open failure. After the present determination, the switching unit 13 is returned to the initial state.

Figure 11:
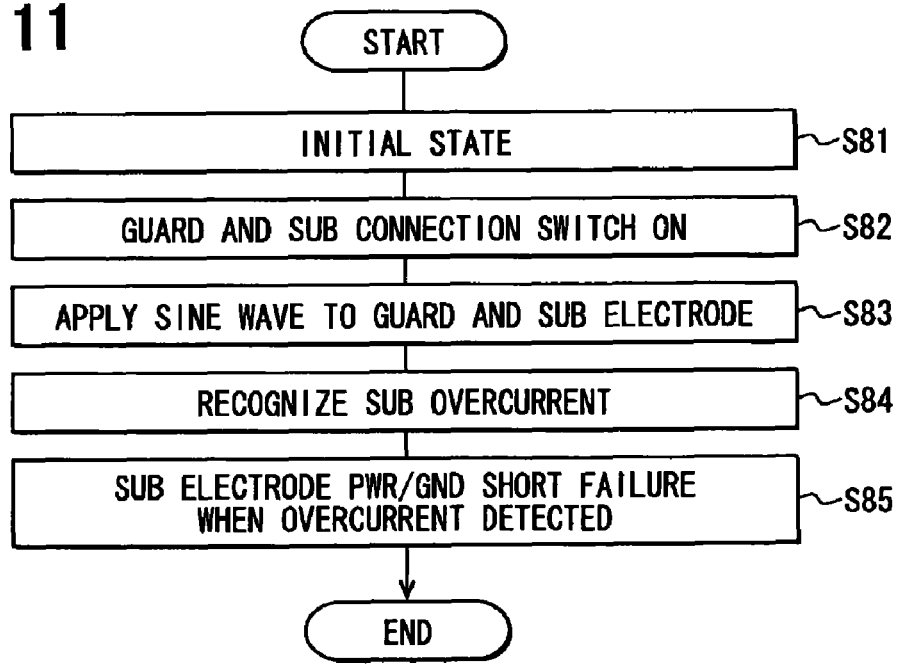
FIG. 11 is a flow chart showing an operation to recognize a power supply short failure of the sub-electrode of the electrostatic occupant detection apparatus according to the embodiment.

Subsequently, a determination of a power supply short failure of the sub-electrode 31c will be described with reference to FIG. 11. At step S81, the electrostatic occupant detection apparatus 10 is in an initial state. Subsequent to step S81, at step S82, both the guard electrode connection switch 13b1 and the sub-electrode connection switch 13c1 are activated (turned ON), while the main electrode connection switch 13a1 is in an open state. Subsequently, at step S83, the VSG applies a sine wave to both the guard electrode 31b and the sub-electrode 31c. Thereby, as specified by No. 11a, the main electrode 31a is in an open state, and the guard electrode 31b and the sub-electrode 31c are applied with a sine wave to be in the sine-wave application state. In the present state, at step S84, the CPU 15 recognizes a detection state of the sub-overcurrent detection unit 46c. When the CPU 15 recognizes the detection state to be an overcurrent, at step S85, the CPU 15 determines the sub-electrode 31c to be a power supply short failure. In a state other than the present case, the CPU 15 determines the sub-electrode 31c not to be a power supply short failure. After the present determination, the switching unit 13 is returned to the initial state.

Similarly, a determination of a GND short failure of the sub-electrode 31*c* will be described with reference to FIG. 11. At step. S81, the electrostatic occupant detection apparatus 10 is in an initial state. Subsequent to step S81, at step S82, both the guard electrode connection switch 13*b*1 and the sub-electrode connection switch 13*c*1 are activated (turned ON), while the main electrode connection switch 13*a*1 is in an open state. Subsequently, at step S83, the VSG applies a sine wave to both the guard electrode 31*b* and the sub-electrode 31*c*. Thereby, as specified by No. 12*a*, the main electrode 31*a* is in an open state, and the guard electrode 31*b* and the sub-electrode 31*c* are applied with a sine wave to be in the sine-wave application state. In the present state, at step S84, the CPU 15 recognizes a detection state of the sub-overcurrent detection unit 46*c*. When the CPU 15 recognizes the detection state to be an overcurrent, at step S85, the CPU 15 determines the sub-electrode 31*c* to be a GND short failure. In a state other than the present case, the CPU 15 determines the sub-electrode 31*c* not to be a GND short failure. After the present determination, the switching unit 13 is returned to the initial state.

As described above, an open failure and a short failure related to the main electrode 31*a*, the guard electrode 31*b*, and the sub-electrode 31*c* are determined. It is noted that the determination result may be indicated on an indication unit (not shown) such that the determination result can be recognized by a user.

The electrostatic occupant detection apparatus 10 according to the present embodiment includes an electrostatic sensor 31 including a main electrode 31*a*, a sub-electrode 31*c*, and a guard electrode 31*b*. The main electrode 31*a* and the sub-electrode 31*c* are located in a seat of a vehicle in an isolated state from each other. The guard electrode 31*b* is located between the vehicle body, which is conductive with a vehicle grounding portion, and the main electrode 31*a*. The guard electrode 31*b* is spaced from both the vehicle body and the main electrode 31*a*. The electrostatic occupant detection apparatus 10 further includes the sensor-characteristics detection unit 14. The sensor-characteristics detection unit 14 selectively sets each of the main electrode 31*a*, the sub-electrode 31*c*, and the guard electrode 31*b* of the electrostatic sensor 31 to be in a sine-wave application state, an open state, or a grounding state. The sensor-characteristics detection unit 14 further selects an electric current caused in each of the electrodes 31*a* to 31*c* in a sine-wave application state, an open state, or a grounding state and converts the selected electric current into a voltage value. The sensor-characteristics detection unit 14 further separately detects an overcurrent flowing through each of the electrodes 31*a* to 31*c* when applying a sine wave. The electrostatic occupant detection apparatus 10 further includes the CPU 15. The CPU 15 determines an open failure, a power supply short failure, and a GND short failure of each of the electrodes 31*a* to 31*c*, according to any one of or a combination among a voltage value and an overcurrent detected by the sensor-characteristics detection unit 14. The power supply short failure occurs when a path of a power supply connected to a signal source, which applies a sine wave to each of the electrodes 31*a* to 31*c*, causes a short-circuit with another electric conductive element. The CPU 15 further determines a short failure between the main electrode 31*a* and the guard electrode 31*b*, a short failure between the main electrode 31*a* and the sub-electrode 31*c*, and a short failure between the guard electrode 31*b* and the sub-electrode 31*c*.

According to the present structure, a failure of the electrostatic sensor 31 itself is detectable. In addition, an open failure and a short failure of each of the main electrode 31*a*, the sub-electrode 31*c*, and the guard electrode 31*b* of the electrostatic sensor 31 are detectable.

It is noted that the electrostatic sensor 12 may not include the sub-electrode 31*c*. In this case, an open failure and a short failure of each of the main electrode 31*a* and the guard electrode 31*b* are detectable.

In the electrostatic occupant detection apparatus 10, the sensor-characteristics detection unit 14 sets the main electrode 31*a* and the guard electrode 31*b* to be in an application state of a sine wave and sets the sub-electrode 31*c* to be in an open state. In the present state, the sensor-characteristics detection unit 14 selects an electric current flowing through the main electrode 31*a* and converts the selected electric current into a voltage value. The sensor-characteristics detection unit 14 performs a first recognition in which the CPU 15 recognizes the converted voltage value as a detection value of an electric capacity of the main electrode 31*a*. The sensor-characteristics detection unit 14 sets the main electrode 31*a* and the guard electrode 31*b* to be in an application state of a sine wave and sets the sub-electrode 31*c* to be in a grounding state. In the present state, the sensor-characteristics detection unit 14 selects an electric current flowing through the main electrode 31*a* and converts the selected electric current into a voltage value. The sensor-characteristics detection unit 14 performs a second recognition in which the CPU 15 recognizes the converted voltage value as a detection value of an electric capacity of the main electrode 31*a*. Further, the sensor-characteristics detection unit 14 sets the main electrode 31*a* to be in an, application state of a sine wave, sets the guard electrode 31*b* to be in a grounding state, and sets the sub-electrode 31*c* to be in an open state. In the present state, the sensor-characteristics detection unit 14 performs a third recognition in which the CPU 15 recognizes detection or non-detection of an overcurrent in the main electrode 31*a*. When there is no change between a detection value in the first recognition and a detection value in the second recognition and when not recognizing an overcurrent in the third recognition, the CPU determines the main electrode 31*a* to be an open failure. In this manner, an open failure of the main electrode 31*a* can be determined.

Further, in the electrostatic occupant detection apparatus 10, the sensor-characteristics detection unit 14 sets the main electrode 31*a* and the guard electrode 31*b* to be in an application state of a sine wave and sets the sub-electrode 31*c* to be in an open state. In the present state, the CPU 15 recognizes detection or non-detection of an overcurrent in the main electrode 31*a*. When recognizing detection of an overcurrent, the CPU 15 determines the main electrode 31*a* to be a power supply short failure or a GND short failure. In this manner, a power supply short failure or a GND short failure of the main electrode 31*a* can be determined.

In the electrostatic occupant detection apparatus 10, the sensor-characteristics detection unit 14 sets the main electrode 31*a* and the guard electrode 31*b* to be in an application state of a sine wave and sets the sub-electrode 31*c* to be in an open state. In the present state, the sensor-characteristics detection unit 14 selects an electric current flowing through the main electrode 31*a* and converts the selected electric current into a voltage value. The sensor-characteristics detection unit 14 performs a first recognition in which the CPU 15 recognizes the converted voltage value as a detection value of an electric capacity of the main electrode 31*a*. The sensor-characteristics detection unit 14 sets the main electrode 31*a* to be in an application state of a sine wave, sets the guard electrode 31b to be in an open state, and sets the sub-electrode 31c to be in an open state. In the present state, the sensor-characteristics detection unit 14 selects an electric current flowing through the main electrode 31a and converts the selected electric current into a voltage value. The sensor-characteristics detection unit 14 performs a second recognition in which the CPU 15 recognizes the converted voltage value as a detection value of an electric capacity of the main electrode 31a. When the difference between a detection value in the first recognition and a detection value in the second recognition is greater than a predetermined value (threshold), the CPU 15 determines that a short failure occurs between the main electrode 31a and the guard electrode 31b. In this manner, a short failure between the main electrode 31a and the guard electrode 31b can be determined.

Further, in the electrostatic occupant detection apparatus 10, the sensor-characteristics detection unit 14 sets the main electrode 31a and the guard electrode 31b to be in an application state of a sine wave and sets the sub-electrode 31c to be in a grounding state. In the present state, the CPU 15 recognizes detection or non-detection of an overcurrent in the main electrode 31a. When recognizing detection of an overcurrent, the CPU 15 determines that a short failure occurs between the main electrode 31a and the sub-electrode 31c. In this manner, a short failure between the main electrode 31a and the sub-electrode 31c can be determined.

Further, in the electrostatic occupant detection apparatus 10, the sensor-characteristics detection unit 14 sets the main electrode 31a to be in an application state of a sine wave, sets the guard electrode 31b to be in a grounding state, and sets the sub-electrode 31c to be in an open state. In the present state, the CPU 15 recognizes detection or non-detection of an overcurrent in the main electrode 31a. When not recognizing detection of an overcurrent, the CPU 15 determines the sub-electrode 31c to be an open failure. In this manner, an open failure of the guard electrode 31b can be determined.

Further, in the electrostatic occupant detection apparatus 10, the sensor-characteristics detection unit 14 sets the main electrode 31a and the guard electrode 31b to be in an application state of a sine wave and sets the sub-electrode 31c to be in an open state. In the present state, the CPU 15 recognizes detection or non-detection of an overcurrent in the guard electrode 31b. When recognizing detection of an overcurrent, the CPU 15 determines that the guard electrode 31b to be a power supply short failure or a GND short failure. In this manner, a power supply short failure or a GND short failure of the guard electrode 31b can be determined.

Further, in the electrostatic occupant detection apparatus 10, the sensor-characteristics detection unit 14 sets the main electrode 31a and the guard electrode 31b to be in an application state of a sine wave and sets the sub-electrode 31c to be in a grounding state. In the present state, the CPU 15 recognizes detection or non-detection of an overcurrent in the guard electrode 31b. When recognizing detection of an overcurrent, the CPU 15 determines that a short failure occurs between the guard electrode 31b and the sub-electrode 31c. In this manner, a short failure between the guard electrode 31b and the sub-electrode 31c can be determined.

In the electrostatic occupant detection apparatus 10, the sensor-characteristics detection unit 14 sets the main electrode 31a and the guard electrode 31b to be in an application state of a sine wave and sets the sub-electrode 31c to be in an open state. In the present state, the sensor-characteristics detection unit 14 selects an electric current flowing through the main electrode 31a and converts the selected electric current into a voltage value. The sensor-characteristics detection unit 14 performs a first recognition in which the CPU 15 recognizes the converted voltage value as a detection value of an electric capacity of the main electrode 31a. The sensor-characteristics detection unit 14 sets the main electrode 31a and the guard electrode 31b to be in an application state of a sine wave and sets the sub-electrode 31c to be in a grounding state. In the present state, the sensor-characteristics detection unit 14 selects an electric current flowing through the main electrode 31a and converts the selected electric current into a voltage value. The sensor-characteristics detection unit 14 performs a second recognition in which the CPU 15 recognizes the converted voltage value as a detection value of an electric capacity of the main electrode 31a. When the difference between a detection value in the first recognition and a detection value in the second recognition is less than or equal to a predetermined value (threshold), the CPU 15 determines the sub-electrode 31c to be an open failure. In this manner, an open failure of the sub-electrode 31c can be determined.

Further, in the electrostatic occupant detection apparatus 10, the sensor-characteristics detection unit 14 sets the main electrode 31a to be in an open state and sets the guard electrode 31b and the sub-electrode 31c to be in an application state of a sine wave. In the present state, the CPU 15 recognizes detection or non-detection of an overcurrent in the sub-electrode 31c. When recognizing detection of an overcurrent, the CPU 15 determines that the sub-electrode 31c to be a power supply short failure or a GND short failure. In this manner, a power supply short failure or a GND short failure of the sub-electrode 31c can be determined.

Summarizing the above embodiments, an electrostatic occupant detection apparatus includes:
    an electrostatic sensor including a main electrode located in a vehicle seat and a guard electrode located between a vehicle body and the main electrode and spaced therefrom, the vehicle body being conductive with a vehicle grounding portion;
    a sensor-characteristics detection unit configured to: selectively apply an alternating voltage signal to each of the main electrode and the guard electrode of the electrostatic sensor;
        arbitrarily set each of the main electrode and the guard electrode to one of an open state (opened) and a grounding state (grounded);
        select an electric current in each of the main electrode and the guard electrode In such a state and convert the selected electric current into a voltage value; and
        separately detect an overcurrent in each of the main electrode and the guard electrode when applying the alternating voltage signal; and
    an arithmetic control unit configured to, according to one or a combination of the voltage value and detection or non-detection of the overcurrent detected by the sensor-characteristics detection unit,
    i) determine whether each of the main electrode and the guard electrode to be:
    an open failure;
    a power supply short failure, in which a connection path of a power supply to a signal source for applying the alternating voltage signal to each of the main electrode and the guard electrode is short-circuited with another electric conduction element; or
    a grounding failure, and
    ii) determine whether a short failure occurs between the main electrode and the guard electrode.

According to the present structure, a failure of the electrostatic sensor itself is detectable. In addition, an open failure and a short failure of each of the main electrode and the guard electrode of the electrostatic sensor are detectable.

The electrostatic sensor further includes a sub-electrode located in the vehicle seat and spaced from the main electrode. The sensor-characteristics detection unit is further configured to:
- selectively apply an alternating voltage signal to each of the main electrode, the sub-electrode, and the guard electrode of the electrostatic sensor;
- arbitrarily set each of the main electrode, the sub-electrode, and the guard electrode to one of an open state and a grounding state;
- select an electric current in each of the main electrode, the sub-electrode, and the guard electrode in such a state and convert the selected electric current into a voltage value; and
- separately detect an overcurrent in each of the main electrode, the sub-electrode, and the guard electrode when applying the alternating voltage signal.

The arithmetic control unit is further configured to, according to one or a combination of the voltage value and detection or non-detection of the overcurrent detected by the sensor-characteristics detection unit,
i) determine whether each of the main electrode, the sub-electrode, and the guard electrode to be:
   an open failure;
   a power supply short failure, in which a connection path of the power supply to the signal source for applying the alternating voltage signal to each of the main electrode, the sub-electrode, and the guard electrode is short-circuited with another electric conduction element; or
   a grounding failure, and
ii) determine whether:
   a short failure occurs between the main electrode and the guard electrode;
   a short failure occurs between the main electrode and the sub-electrode; and
   a short failure occurs between the guard electrode and the sub-electrode.

According to the present structure, a failure of the electrostatic sensor itself is detectable. In addition, an open failure and a short failure of each of the main electrode, the sub-electrode, and the guard electrode of the electrostatic sensor are detectable.

The sensor-characteristics detection unit is further configured to perform a first recognition to:
- apply an alternating voltage signal to the main electrode and the guard electrode to be in an application state;
- set the sub-electrode to be in an open state;
- select an electric current in the main electrode in such a state and convert the selected electric current into a voltage value; and
- cause the arithmetic control unit to recognize the converted voltage value as a detection value of an electric capacity of the main electrode.

The sensor-characteristics detection unit is further configured to perform a second recognition to:
- apply an alternating voltage signal to the main electrode and the guard electrode to be in an application state;
- set the sub-electrode to be in a grounding state;
- select an electric current in the main electrode in such a state and convert the selected electric current into a voltage value; and
- cause the arithmetic control unit to recognize the converted voltage value as a detection value of an electric capacity of the main electrode.

The sensor-characteristics detection unit is further configured to perform a third recognition to:
- apply an alternating voltage signal to the main electrode to be in an application state;
- set the guard electrode to be in a grounding state;
- set the sub-electrode to be in an open state; and
- cause the arithmetic control unit to recognize detection or non-detection of an overcurrent in the main electrode in such a state.

The arithmetic control unit determines the main electrode to be an open failure when:
- there is no change between the detection value in the first recognition and the detection value in the second recognition; and
- the arithmetic control unit recognizes non-detection of an overcurrent in the third recognition.

In this manner, an open failure of the main electrode can be determined.

The sensor-characteristics detection unit is further configured to:
- apply an alternating voltage signal to the main electrode and the guard electrode to be in an application state;
- set the sub-electrode to be in an open state; and
- cause the arithmetic control unit to recognize detection or non-detection of an overcurrent in the main electrode in such a state.

The arithmetic control unit is further configured to determine the main electrode to be a power supply short failure or a grounding failure when recognizing detection of an overcurrent.

In this manner, a power supply short failure or a grounding failure of the main electrode can be determined.

The sensor-characteristics detection unit is further configured to perform a first recognition to:
- apply an alternating voltage signal to the main electrode and the guard electrode to be in an application state;
- set the sub-electrode to be in an open state;
- select an electric current in the main electrode in such a state and convert the selected electric current into a voltage value; and
- cause the arithmetic control unit to recognize the converted voltage value as a detection value of an electric capacity of the main electrode.

The sensor-characteristics detection unit is further configured to perform a second recognition to:
- apply an alternating voltage signal to the main electrode to be in an application state;
- set the guard electrode to be in an open state; set the sub-electrode to be in an open state;
- select an electric current in the main electrode in such a state and convert the selected electric current into a voltage value; and
- cause the arithmetic control unit to recognize the converted voltage value as a detection value of an electric capacity of the main electrode.

The arithmetic control unit is further configured to determine that a short failure occurs between the main electrode and the guard electrode when a difference between the detection value in the first recognition and the detection value in the second recognition is greater than a predetermined value.

In this manner, a short failure between the main electrode and the guard electrode can be determined.

The sensor-characteristics detection unit is further configured to:
- apply an alternating voltage signal to the main electrode and the guard electrode to be in an application state;
- set the sub-electrode to be in a grounding state; and cause the arithmetic control unit to recognize detection or non-detection of an overcurrent in the main electrode in such a state.

The arithmetic control unit is further configured to determine that a short failure occurs between the main electrode and the sub-electrode when recognizing detection of an overcurrent.

In this manner, a short failure between the main electrode and the sub-electrode can be determined.

The sensor-characteristics detection unit is further configured to:
apply an alternating voltage signal to the main electrode to be in an application state;
set the guard electrode to be in a grounding state;
set the sub-electrode to be in an open state; and
cause the arithmetic control unit to recognize detection or non-detection of an overcurrent in the main electrode in such a state.

The arithmetic control unit is further configured to determine the guard electrode to be an open failure when recognizing non-detection of an overcurrent.

In this manner, an open failure of the guard electrode can be determined.

The sensor-characteristics detection unit is further configured to:
apply an alternating voltage signal to the main electrode and the guard electrode to be in an application state;
set the sub-electrode to be in a grounding state; and
cause the arithmetic control unit to recognize detection or non-detection of an overcurrent in the guard electrode in such a state.

The arithmetic control unit is further configured to determine the guard electrode to be a power supply short failure or a grounding failure when recognizing detection of an overcurrent.

In this manner, a power supply short failure or a grounding failure of the guard electrode can be determined.

The sensor-characteristics detection unit is further configured to:
apply an alternating voltage signal to the main electrode and the guard electrode to be in an application state;
set the sub-electrode to be in a grounding state; and
cause the arithmetic control unit to recognize detection or non-detection of an overcurrent in the guard electrode in such a state.

The arithmetic control unit is further configured to determine that a short failure occurs between the guard electrode and the sub-electrode when recognizing detection of an overcurrent.

In this manner, a short failure between the guard electrode and the sub-electrode can be determined.

The sensor-characteristics detection unit is configured to perform a first recognition to:
apply the alternating voltage signal to the main electrode and the guard electrode to be in an application state;
set the sub-electrode to be in an open state;
select an electric current in the main electrode in such a state and convert the selected electric current into a voltage value; and
cause the arithmetic control unit to recognize the converted voltage value as a detection value of an electric capacity of the main electrode.

The sensor-characteristics detection unit is further configured to perform a second recognition to:
apply the alternating voltage signal to the main electrode and the guard electrode to be in an application state;
set the sub-electrode to be in a grounding state;
select an electric current in the main electrode in such a state and convert the selected electric current into a voltage value; and
cause the arithmetic control unit to recognize the converted voltage value as a detection value of an electric capacity of the main electrode.

The arithmetic control unit is further configured to determine the sub-electrode to be an open failure when a difference between the detection value in the first recognition and the detection value in the second recognition is less than or equal to a predetermined value.

In this manner, an open failure of the sub-electrode can be determined.

The sensor-characteristics detection unit is further configured to: set the main electrode to be in an open state; apply an alternating voltage signal to the guard electrode and the sub-electrode to be in an application state; cause the arithmetic control unit to recognize detection or non-detection of an overcurrent in the sub-electrode in such a state.

The arithmetic control unit is further configured to determine the sub-electrode to be a power supply short failure or a grounding failure when recognizing detection of an overcurrent.

In this manner, a power supply short failure or a grounding failure of the sub-electrode can be determined.

The above structures of the embodiments can be combined as appropriate.

The above processings such as calculations and determinations are not limited being executed by the occupant detection ECU 10. The control unit may have various structures including the occupant detection ECU 10 shown as an example.

The above processings such as calculations and determinations may be performed by any one or any combinations of software, an electric circuit, a mechanical device, and the like. The software may be stored in a storage medium, and may be transmitted via a transmission device such as a network device. The electric circuit may be an integrated circuit, and may be a discrete circuit such as a hardware logic configured with electric or electronic elements or the like. The elements producing the above processings may be discrete elements and may be partially or entirely integrated.

It should be appreciated that while the processes of the embodiments of the present invention have been described herein as including a specific sequence of steps, further alternative embodiments including various other sequences of these steps and/or additional steps not disclosed herein are intended to be within the steps of the present invention.

Various modifications and alternations may be diversely made to the above embodiments without departing from the spirit of the present invention.

What is claimed is:
1. An electrostatic occupant detection apparatus comprising:
an electrostatic sensor including a main electrode, which is located in a vehicle seat, and a guard electrode, which is located between a vehicle body and the main electrode and spaced from the vehicle body and the main electrode, the vehicle body being conductive with a vehicle grounded portion;
a sensor-characteristics detection unit configured to:
selectively apply an alternating voltage signal to each of the main electrode and the guard electrode of the electrostatic sensor;
selectively cause each of the main electrode and the guard electrode to be opened or grounded;

cause, in these conditions, a selection unit to select a potential difference between ends of one of resistors connected to the main electrode and the guard electrode respectively;

cause a current conversion unit to convert the selected potential difference into an electric current;

cause a voltage conversion unit to convert the electric current into a voltage value; and cause an overcurrent detection unit separately to detect an overcurrent in each of the main electrode and the guard electrode when the alternating voltage signal is applied; and an arithmetic control unit configured to, according to one or a combination of the voltage value detected by the sensor-characteristics detection unit and detection or non-detection of the overcurrent by the sensor-characteristics detection unit:

determine whether an open failure occurs in each of the main electrode and the guard electrode;

determine whether a power supply short failure occurs due to a short-circuit between a connection path from a power supply to a signal source, which is for applying the alternating voltage signal to each of the main electrode and the guard electrode, and another electric conduction element;

determine whether a grounded failure occurs in each of the main electrode and the guard electrode; and determine whether a short failure occurs between the main electrode and the guard electrode.

2. The electrostatic occupant detection apparatus according to claim 1, wherein the electrostatic sensor further includes a sub-electrode located in the vehicle seat and spaced from the main electrode, the sensor-characteristics detection unit is further configured to:

selectively apply an alternating voltage signal from the signal source to each of the main electrode, the sub-electrode, and the guard electrode;

selectively cause each of the main electrode, the sub-electrode, and the guard electrode to be opened or grounded;

select an electric current in one of the main electrode, the sub-electrode, and the guard electrode and convert the selected electric current into a voltage value; and separately detect an overcurrent in each of the main electrode, the sub-electrode, and the guard electrode when applying an alternating voltage signal, the arithmetic control unit is further configured to, according to one or a combination of the voltage value detected by the sensor-characteristics detection unit and detection or non-detection of the overcurrent by the sensor-characteristics detection unit:

determine whether an open failure occurs in each of the main electrode, the sub-electrode, and the guard electrode;

determine whether a power supply short failure or a grounded failure occurs due to a short-circuit between the connection path from the power supply to the signal source and another electric conduction element;

determine whether a short failure occurs between the main electrode and the guard electrode;

determine whether a short failure occurs between the main electrode and the sub-electrode; and determine whether a short failure occurs between the guard electrode and the sub-electrode.

3. The electrostatic occupant detection apparatus according to claim 2, wherein the sensor-characteristics detection unit is further configured to perform a first recognition to:

apply an alternating voltage signal to the main electrode and the guard electrode;

cause the sub-electrode to be opened;

select an electric current in the main electrode and convert the selected electric current into a voltage value; and cause the arithmetic control unit to recognize the converted voltage value as a first detection value of an electric capacity of the main electrode, the sensor-characteristics detection unit is further configured to perform a second recognition to:

apply an alternating voltage signal to the main electrode and the guard electrode;

cause the sub-electrode grounded;

select an electric current in the main electrode and convert the selected electric current into a voltage value; and cause the arithmetic control unit to recognize the converted voltage value as a second detection value of an electric capacity of the main electrode, the sensor-characteristics detection unit is further configured to perform a third recognition to:

apply an alternating voltage signal to the main electrode;

cause the guard electrode to be grounded;

cause the sub-electrode to be opened; and cause the arithmetic control unit to recognize detection or non-detection of an overcurrent in the main electrode, and the arithmetic control unit is further configured to determine the main electrode to be an open failure when:

the first detection value in the first recognition and the second detection value in the second recognition have no change therebetween; and the arithmetic control unit recognizes non-detection of an overcurrent in the third recognition.

4. The electrostatic occupant detection apparatus according to claim 2, wherein the sensor-characteristics detection unit is further configured to:

apply an alternating voltage signal to the main electrode and the guard electrode;

cause the sub-electrode to be opened; and cause the arithmetic control unit to recognize detection or non-detection of an overcurrent in the main electrode, and the arithmetic control unit is configured to determine the main electrode to be a power supply short failure or a grounded failure when recognizing detection of an overcurrent.

5. The electrostatic occupant detection apparatus according to claim 2, wherein the sensor-characteristics detection unit is configured to perform a first recognition to:

apply an alternating voltage signal to the main electrode and the guard electrode;

cause the sub-electrode to be opened;

select an electric current in the main electrode and convert the selected electric current into a voltage value; and cause the arithmetic control unit to recognize the converted voltage value as a first detection value of an electric capacity of the main electrode, the sensor-characteristics detection unit is further configured to perform a second recognition to:
apply an alternating voltage signal to the main electrode;
cause the guard electrode to be opened;
cause the sub-electrode to be opened;
select an electric current in the main electrode and convert the selected electric current into a voltage value; and
cause the arithmetic control unit to recognize the converted voltage value as a second detection value of an electric capacity of the main electrode, and
the arithmetic control unit is further configured to determine that a short failure occurs between the main electrode and the guard electrode when a difference between the first detection value in the first recognition and the second detection value in the second recognition is greater than a threshold.

6. The electrostatic occupant detection apparatus according to claim 2, wherein
the sensor-characteristics detection unit is further configured to:
apply an alternating voltage signal to the main electrode and the guard electrode;
cause the sub-electrode grounded; and
cause the arithmetic control unit to recognize detection or non-detection of an overcurrent in the main electrode, and
the arithmetic control unit is further configured to determine that a short failure occurs between the main electrode and the sub-electrode when recognizing detection of an overcurrent.

7. The electrostatic occupant detection apparatus according to claim 2, wherein
the sensor-characteristics detection unit is further configured to:
apply an alternating voltage signal to the main electrode;
cause the guard electrode grounded;
cause the sub-electrode to be opened; and
cause the arithmetic control unit to recognize detection or non-detection of an overcurrent in the main electrode, and
the arithmetic control unit is further configured to determine the guard electrode to be an open failure when recognizing non-detection of an overcurrent.

8. The electrostatic occupant detection apparatus according to claim 2, wherein
the sensor-characteristics detection unit is further configured to:
apply an alternating voltage signal to the main electrode and the guard electrode;
cause the sub-electrode opened; and
cause the arithmetic control unit to recognize detection or non-detection of an overcurrent in the guard electrode, and
the arithmetic control unit is further configured to determine the guard electrode to be a power supply short failure or a grounded failure when recognizing detection of an overcurrent.

9. The electrostatic occupant detection apparatus according to claim 2, wherein
the sensor-characteristics detection unit is further configured to:
apply an alternating voltage signal to the main electrode and the guard electrode;
cause the sub-electrode grounded; and
cause the arithmetic control unit to recognize detection or non-detection of an overcurrent in the guard electrode, and
the arithmetic control unit is further configured to determine that a short failure occurs between the guard electrode and the sub-electrode when recognizing detection of an overcurrent.

10. The electrostatic occupant detection apparatus according to claim 2, wherein
the sensor-characteristics detection unit is configured to perform a first recognition to:
apply an alternating voltage signal to the main electrode and the guard electrode;
cause the sub-electrode to be opened;
select an electric current in the main electrode and convert the selected electric current into a voltage value; and
cause the arithmetic control unit to recognize the converted voltage value as a first detection value of an electric capacity of the main electrode,
the sensor-characteristics detection unit is further configured to perform a second recognition to:
apply an alternating voltage signal to the main electrode and the guard electrode;
cause the sub-electrode grounded;
select an electric current in the main electrode and convert the selected electric current into a voltage value; and
cause the arithmetic control unit to recognize the converted voltage value as a second detection value of an electric capacity of the main electrode, and
the arithmetic control unit is further configured to determine the sub-electrode to be an open failure when a difference between the first detection value in the first recognition and the second detection value in the second recognition is less than or equal to a threshold.

11. The electrostatic occupant detection apparatus according to claim 2, wherein
the sensor-characteristics detection unit is further configured to:
cause the main electrode to be opened;
apply an alternating voltage signal to the guard electrode and the sub-electrode; and
cause the arithmetic control unit to recognize detection or non-detection of an overcurrent in the sub-electrode, and
the arithmetic control unit is further configured to determine the sub-electrode to be a power supply short failure or a grounded failure when recognizing detection of an overcurrent.

* * * * *